(12) United States Patent
Zhu et al.

(10) Patent No.: US 7,928,522 B2
(45) Date of Patent: Apr. 19, 2011

(54) ARRANGEMENTS FOR AND FABRICATION OF MECHANICAL SUSPENSION OF A MOVABLE STRUCTURE

(75) Inventors: Terry Zhu, Fremont, CA (US); Nickolai Belov, Los Gatos, CA (US)

(73) Assignee: Intel Corporation, Santa Clara, CA (US)

( * ) Notice: Subject to any disclaimer, the term of this patent is extended or adjusted under 35 U.S.C. 154(b) by 601 days.

(21) Appl. No.: 11/904,464

(22) Filed: Sep. 27, 2007

(65) Prior Publication Data

US 2009/0084946 A1    Apr. 2, 2009

(51) Int. Cl.
*G21K 7/00* (2006.01)

(52) U.S. Cl. ........................................................ 257/415

(58) Field of Classification Search .................... 257/415
See application file for complete search history.

(56) References Cited

U.S. PATENT DOCUMENTS

| | | | |
|---|---|---|---|
| 2004/0207034 A1* | 10/2004 | Sakai | 257/420 |
| 2005/0219016 A1* | 10/2005 | Chou et al. | 335/78 |
| 2008/0237755 A1* | 10/2008 | Chou | 257/415 |

* cited by examiner

*Primary Examiner* — Thomas L Dickey
(74) *Attorney, Agent, or Firm* — Schubert Law Group PLLC; Jeffrey S. Schubert

(57) ABSTRACT

In one embodiment a micro-electro mechanical system is disclosed. A MEMS structure can include a frame, a movable structure and a set of structural beams to suspend the movable structure from the frame. The system can also include a set of conductor routing beams. The conductor routing beams can provide a conductive path from the frame to the movable structure. The set of structural beams can have a spring rate that is more than ten times the spring rate of the set of conductor routing beams. Accordingly, multiple routing beams can be utilized to support multiple conductors without significantly affecting the mechanical movement or dynamic properties of the movable structure.

15 Claims, 7 Drawing Sheets

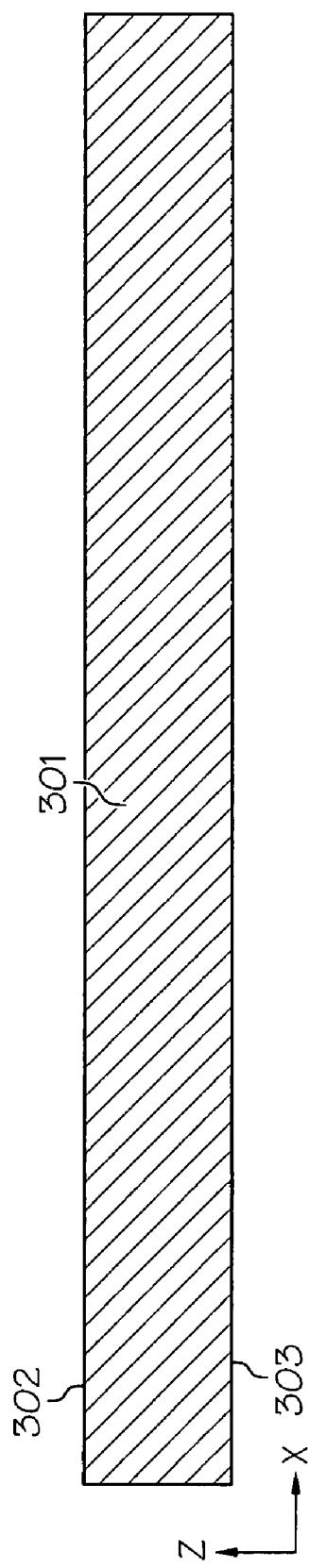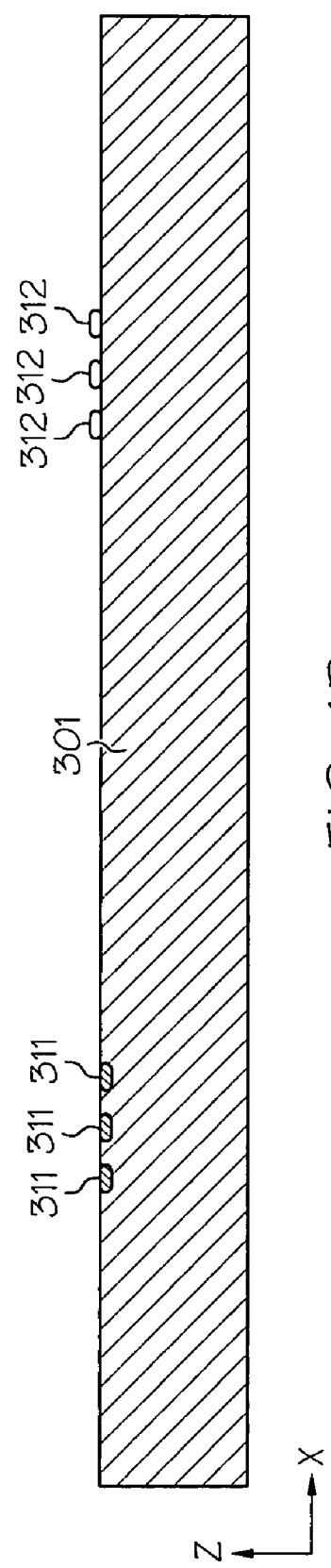

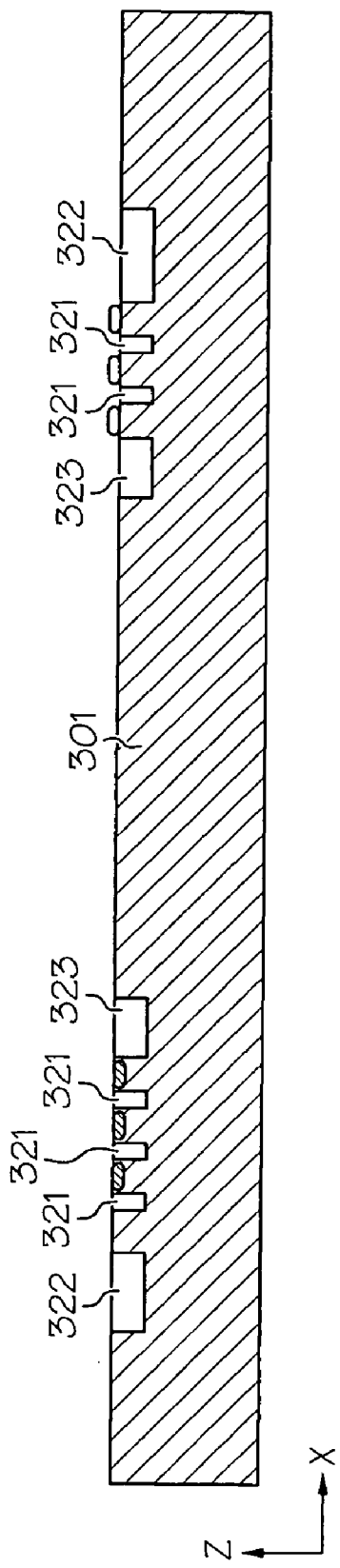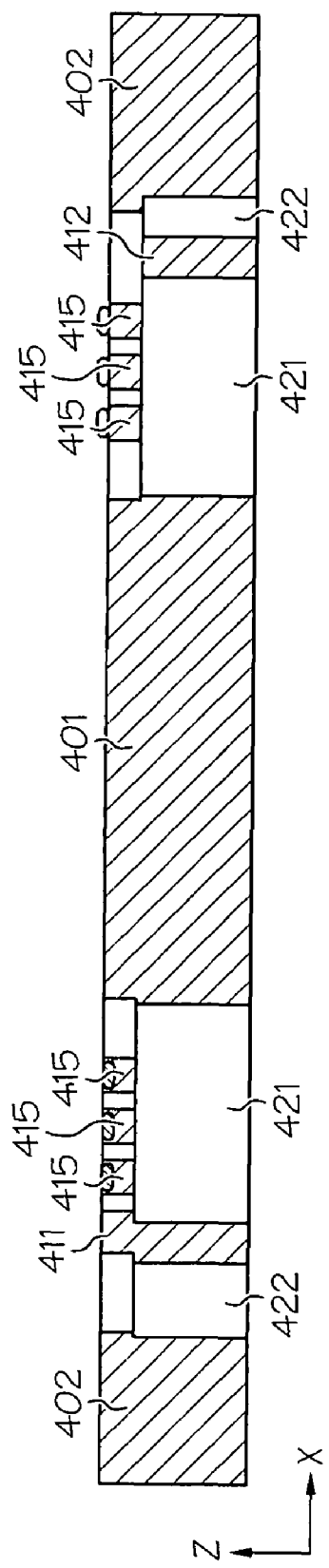
FIG. 4C
FIG. 4D

ARRANGEMENTS FOR AND FABRICATION OF MECHANICAL SUSPENSION OF A MOVABLE STRUCTURE

FIELD

The present disclosure is related to the field of electronics and more particularly to the field of micro electro mechanical systems and devices.

BACKGROUND

Micro-electro mechanical systems (MEMS) continue to improve in functionality. New uses and applications for such devices continue to be discovered. MEMS can contain both mechanical structures and integrated circuit (IC) type electrical components. For example, very small mechanical switches, mirrors, sensors, can be manufactured using silicon manufacturing technology. Generally, devices of such MEMS can be manufactured in large quantities at low cost, making them cost-effective for many uses.

There is a group of MEMS based devices built with a stationary frame that have at least one beam (possibly a cantilever beam) that connects a "movable" member to the stationary frame. As stated above the moveable portion or member can be a switch contact, a mirror, an accelerometer, an optical switch utilizing movable mirrors, a probe storage, or MEMS memory device, and a cell sorting device to name a few. In some MEMS, it is necessary to integrate at least one electrical component on the movable member. In these systems, one must provide electrical connections to these components. In one type of system, probe storage devices will have a movable member or movable structure that can be utilized to provide motion of a ceramic or semiconductor tip such as an atomic force microscope (AFM) tip, working as a read-write head, with respect to a memory/data storage material.

Mechanical properties of suspension structures and moveable members and their dependence on time, temperature and mechanical load are very important design constraints. The mechanical configuration and materials utilized in each design can significantly change the functionality and performance of a MEMS device. Designers often try to provide suspension arrangements with very stable mechanical properties with large lifetimes, wide temperature ranges and high reliability under a wide range of mechanical loads. Time dependence of mechanical properties of suspension arrangements, as for example, time dependence of suspension spring constant can cause short-term and long-term instability of parameters of MEMS devices. Temperature dependence of suspension parameters can cause significant temperature dependence of parameters of MEMS. Significant dependence of suspension properties on mechanical load can cause non-linear effects in MEMS. All the above types of instability are highly undesirable in most applications.

It can be appreciated that an electrical connection between the stationary frame and the movable portion or movable structure is often required and can be established by different means. For example, an electrical connection can be provided through the body of the substrate either using conductivity of bulk material or with help of highly conductive layers formed within the body of the wafer. In such cases, the body of the suspension beam can be utilized as a conductor or a low-resistive layer can be created within the suspension beams using, for example, ion implant or silicidation. An electrical connection can also be formed between the frame and the movable structure by depositing conductive layers on top of the suspension. Different metals, poly-silicon, and other conductive materials, as for example, titanium nitride can be used for this purpose. Suspension beams also can be made out of such conductive material.

The above described approaches are less than perfect and have many drawbacks and deficiencies. For example if the electrical connection to the movable structure is established through the bulk of the wafer, typically very few electrical connections can be made, as for example, a power connection and a ground connection. Providing more than one connection can require electrical isolation between different conductors. Although this task can be solved, for example, by using SOI material, forming suspension beams in the device layer and isolating the conductors from each other by trenches etched through the device layer, these approaches are costly and require either special material or complex manufacturing processes. Therefore, designs utilizing electrical connections through the bulk of the substrate have limited application.

Placing a metal conductor on top of the suspension beams as well as using conductive layers within body of the wafer can create a "bi-metallic" configuration, where different layers have different coefficients of thermal expansion and temperature changes can make the beams bend either up or down depending on whether the temperature rises and falls. Such temperature dependent bending can cause significant temperature dependence of parameters of MEMS devices, which is highly undesirable in most cases. Besides that, deposited layers of metal can create built-in stress in the beams from this deposition of conductive material. This stress can change with time and also after exposure to temperature cycles. For example phenomenon known as stress relaxation can cause undesirable changes in the suspension parameters. This change in parameters of MEMS device can cause thermal hysteresis, fracture and fatigue among other things. Therefore, this "sandwich" approach is also less than perfect.

Using suspension structures that are manufactured out of conducting material that is different from material of the wafer, is also less than perfect because of the stress gradients, which are typically present in the deposited metal layer(s). The stress gradient can be result from metal deposition processes such as sputtering, evaporation, plating, etc. The stress gradient can cause bending and other deformation of suspension beams. Beams with built-in stress gradient also can undergo other phenomena such as stress relaxation making suspension properties unstable in time and dependent on temperature.

As stated above, one technical challenge is that often a movable structure can require numerous conductors and thus, numerous conductors need to be provided from the frame to the movable structure. In some cases-conductors should be capable of carrying significant current. Since the suspension beams are relatively narrow in many cases, typically only a limited number of conductors such as one or two conductors can be placed on top of a suspension beam. Increasing the number of suspension beams is undesirable in many cases as this may cause significant changes in mechanical properties of the suspension. In particular, increasing the spring constant of the suspension beyond an acceptable limit can adversely affect the entire design. Therefore, providing the required number of electrical connections to the movable part of MEMS devices can be a challenging task.

BRIEF DESCRIPTION OF THE DRAWINGS

Aspects of the invention will become apparent upon reading the following detailed description and upon reference to the accompanying drawings in which, like references may indicate similar elements:

FIGS. 4A-D illustrates series of fabrication steps for a MEMS device; and

DETAILED DESCRIPTION OF EMBODIMENTS

Figure 1A:
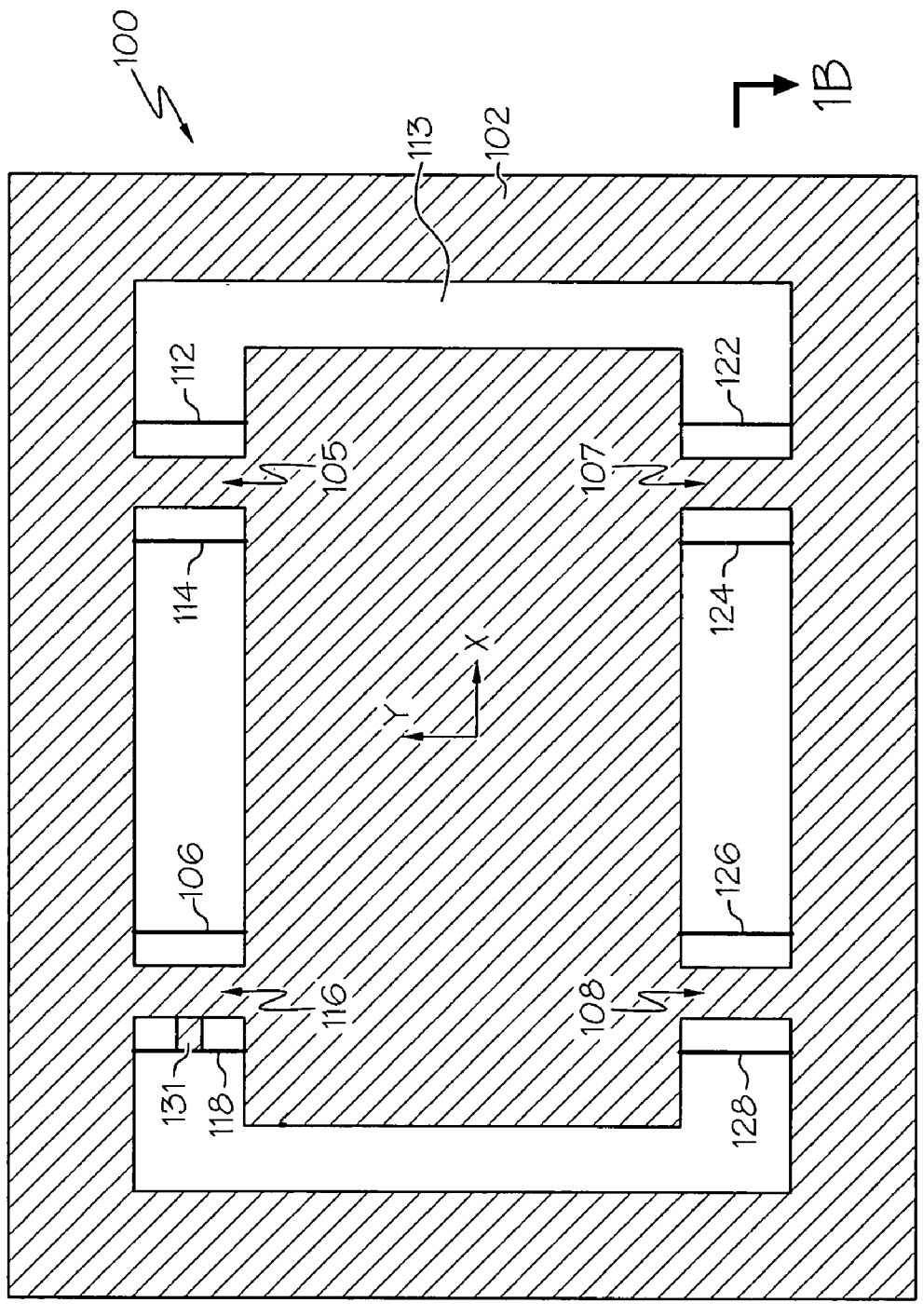
FIG. 1A is a cross sectional top view of a MEMS device.

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

While specific embodiments will be described below with reference to particular configurations of hardware and/or software, those of skill in the art will realize that embodiments of the present invention may advantageously be implemented with other equivalent hardware and/or software systems. Aspects of the disclosure described herein such as computer controlled manufacturing may be stored or distributed on computer-readable media, including magnetic and optically readable and removable computer disks, as well as distributed electronically over the Internet or over other networks, including wireless networks. Data structures and transmission of data (including wireless transmission) particular to aspects of the disclosure are also encompassed within the scope of the disclosure.

In one embodiment, a micro-electro mechanical system (MEMS structure) is disclosed. The MEMS structure fabricated on a substrate or on a wafer can include a stationary frame, a movable structure or movable member, and a suspension. The suspension can support the movable structure and can include a set of structural beams and a set of conductor routing beams between the frame and the movable structure. The set of structural beams can consist of at least one structural beam and the set of conductor routing beams can consists of at least one conductor routing beam. The movable structure can have at least one degree of freedom for motion. For example, movable structure can have one translational degree of freedom, two translational degrees of freedom, one rotational degree of freedom, etc. Motion of the movable structure within each of its degrees of freedom can be achieved due to forces applied to the movable structure. The forces can cause the movable structure to displace from its neutral position. A restoring force proportional to the displacement of the movable structure with respect to the neutral position can be generated by the suspension beams in response to the applied force. The displacement of the movable structure can be determined by a balance between the applied force and the restoring force provided by the suspension.

The suspension can be characterized by a set of spring constants. Each spring constant or spring rate is associated with the corresponding degree of freedom of the movable structure. For example, if the movable structure rotates around the X axis located in plane of the wafer or frame then its suspension is characterized by a torsional spring-constant around X-axis. If the movable structure moves significantly in both the X and Y directions in the plane of the frame then suspension can be characterized by two translational spring constants in X direction and in Y direction reflecting ability of the movable structure to move in these directions responding to a force applied to it. Therefore, in general, suspension and movement in all directions can be characterized by a set of spring constants. The spring constant of suspension reveals a force required per unit of a lateral or angular displacement of the movable structure 101 in corresponding degree of freedom. The set of structural beams can be the major contributor to the spring constants corresponding to some of the degrees of freedom of the movable structure. In particular, spring constant of the set of the structural beams can be more than ten times the spring constant of the set of the conductor routing beams for at least one degree of freedom of the movable structure. The set of conductor routing beams can provide a majority of electrical connections from the frame to the movable structure. Accordingly, multiple routing beams can be utilized to support multiple conductors without significantly affecting the mechanical movement dynamics of the movable structure.

FIGS. 1A and B show a MEMS device 100, which can be fabricated from a semiconductor substrate. The device can have a frame 102, a movable member or movable structure 101, a set of main suspension beams or structural beams 105, 106, 107, and 108, (structural beams 105-108) and a set of routing beams 112, 114, 116, 118, 122, 124, 126, and 128 (routing beams 112-128). In order to provide required functionality of the MEMS device, the movable member 101 should have at least one degree of freedom in its motion. Structural beams 105-108 and routing beams 112-128 can suspend movable structure 101 such that the movable structure can move in at least one direction or in a particular plane.

The movable structure 101 could be manufactured as a component such as an accelerometer, a gyroscope, an electrical contact, a mirror, an optical switch, a add-drop multiplexer, an optical radiation modulator, a cantilever with AFM tip, a probe storage device, a micro-tweezers, a precision MEMS-based positioning stage, an electrostatic actuator, an electromagnetic actuator, a piezoelectric actuator, thermal actuator, and valve. The movable structure 101 could be manufactured as a components such as an accelerometer, a gyroscope, an electrical contact, a mirror, an optical switch, a add-drop multiplexer, an optical radiation modulator, a cantilever with AFM tip, a probe storage device, a micro-tweezers, a precision MEMS-based positioning stage, an electrostatic actuator, an electromagnetic actuator, a piezoelectric actuator, thermal actuator, and valve.

Figure 1B:
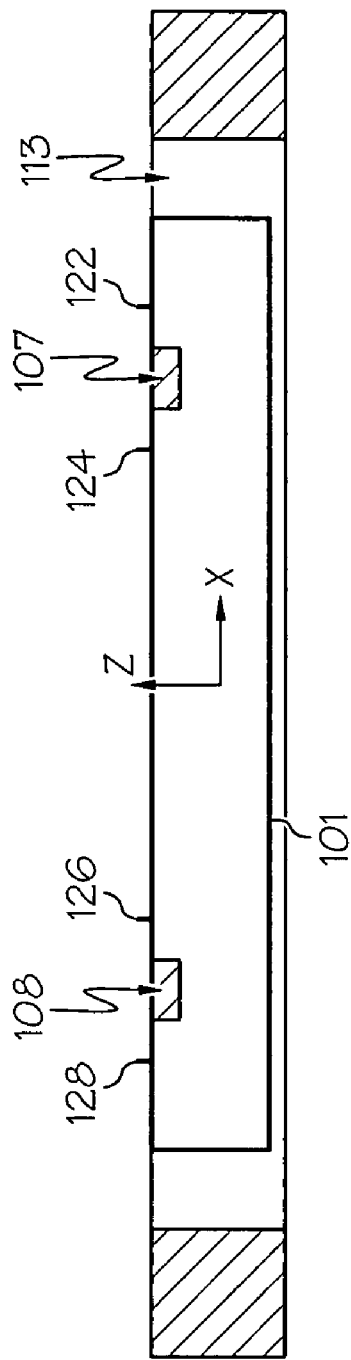
FIG. 1B is a cross sectional side view of the MEMS device of FIG. 1A.

The suspension or beams 105-108 and 112-128 should be compliant enough to allow motion of the movable structure 101 in some directions or degrees of freedom and suppress motion of the movable structure in other directions or degrees of freedom as it can be required by design. The spring rate provided by the suspension can be different for each degree of freedom. Planes X, Y, are illustrated in FIG. 1A and planes X and Z are illustrated in FIG. 1B. Rigidity of the suspension can be different based on the placement and the geometry of the beams 105-108 and 112-128 where their placement and geometry can dictate the spring rate in a particular direction. For example, the suspension of movable structure 101 may suppress motion of the movable structure 101 in the Y direction due to the compression and tension stiffness of the beams 105-108 and 112-128. Accordingly, for each degree of freedom the suspension of the movable structure 101 can be characterized by a spring constant and in specific directions the spring constants can be tightly controlled.

The MEMS device 100 can have electrical components located on the movable structure 101 to achieve a desired function of the system. For example, in a piezo-resistive accelerometer stress-sensitive resistors can be placed on the structural beams 105-108 in locations adjacent to the movable structure 101, where the movable structure 101 can act as a "proof mass" used in traditional accelerometers. As described above, other electrical components or actuators can be formed on the beams 105-108 and 112-128 and on the movable member 101. Conductors for carrying power or a signal can be formed on the movable structure 101.

The structural suspension beams 105-108 can be formed from a bulk material of the substrate, for example from monocrystalline silicon. In some embodiments, the structural beams 105-108 can be bare and have no supplemental layers such as protective layers deposited or grown on the beams 105-108. In other embodiments, it can be beneficial to add at least one protective layer like thermal oxide layer on the structural beams 105-108. In some embodiments the main suspension beams 105-108 have no conductors and have no doped layers or deposited layers, which can cause either stress relaxation or temperature dependent bending of the beams 105-108 due to thermo-mechanical effect. If dielectric protective layers are grown or deposited on the structural beams 105-108 then the thickness of the protective layers can be much smaller than thickness of these beams 105-108 such that the protective layer(s) do not significantly change the spring rates of the beams 105-108. In some embodiments the material utilized to provide the protective dielectric should not exhibit stress relaxation properties. Thin thermal oxide grown on monocrystalline silicon can be a good example of such protective layer with these desired properties.

The routing beams 112-128 can provide an electrical connection between the frame 102 and electrical components located on the movable structure 101. The routing beams 112-128 can be formed from the bulk material of the wafer or can be formed from a different conductive material, as for example, poly-silicon. Each routing beam 112-128 formed from a bulk material of the wafer may include a conductive layer on top of, or within the beam to provide an electrical connection from the frame 102 to the movable structure 101. In some embodiments routing beams 112-128 can be formed from a material of the substrate with and a conductive trace on top of a silicon body. Conductors can be electrically isolated from the substrate with dielectric layers.

Being a part of the suspension structure, both structural beams 105-108 and routing beams 112-128 can contribute to the spring constants of the suspension of the movable structure 101. In some embodiments, monocrystalline silicon can be utilized to manufacture the structural beams 105-108. Monocrystalline silicon's mechanical properties generally change relatively little over time and do not exhibit significant hysteresis, fatigue or creep as a result of mechanical cycling. There are known MEMS structures where monocrystalline silicon suspension beams have survived billions of cycles without measurable change in mechanical properties of the beams. Therefore, in some embodiments structural beams 105-108 can be made from a single piece of monocrystalline silicon. Structural beams 112-128 can provide long-term stability, temperature stability, stable mechanical parameters within wide range of mechanical load and minimal changes in mechanical properties as a result of cyclic mechanical load.

The same may not be true for the rotating beams. Routing beams may have layers, which can cause some change of mechanical properties due to stress relaxation in one of the layers, some temperature dependence of mechanical parameters due to thermo-mechanical stresses, and some change of mechanical properties as a result of cyclic mechanical load due to creep and fatigue.

In some embodiments, the routing beams 112-128 can be made mechanically much weaker than the structural beams 105-108 such as over ten times weaker. Thus, the spring rate of the routing beams 112-128 can be minimized such that a significant number of routing beams and electrical connections can be made between the frame 102 and the movable structure 101 without significantly affecting the spring rates of the suspension in the directions corresponding to some degrees of motion for the movable structure. Accordingly, the mechanical properties of the suspension including the set of spring constants in the directions of motion are dictated mostly by the structural beams 105-108.

In order to minimize the spring rate of the routing beams 112-128 they can be mechanically much thinner, narrower and/or longer than the structural beams 105-108. In some embodiments, the total spring constant of the set of routing beams 112-128 can be over ten (10) times smaller than the spring constant provided by all of the structural beams 105-108. In some embodiments the spring constant of the structural beams 105-108 can be between 100 and 1000 times greater that the spring constant provided by the routing beams 112-128 for each degree of freedom of the movable structure 101. As a result, even significant change in mechanical properties of the routing beams 112-128 or change in the number of routing beams in the design can have a limited effect on the mechanical properties of suspension of the movable structure 101. This feature or arrangement can increase the stability of the mechanical and other parameters of MEMS device 100.

Accordingly, multiple routing beams 112-128 can be utilized to support multiple conductors without significantly affecting the static and dynamic properties of the movable structure 101 and dynamics of the movable part(s) of the MEMS device. The routing beams 122-128 can be connected to the structural beams 107 and 108 with bridges, such as bridge 131 in order to prevent excessive out-of-plane bending of the routing beams 112-128. The bridge 131 can also adjust the resonance frequency of the system or a movement of the movable structure 101. For example, routing beam 118 can be connected to the structural beam 106 with bridge 131. Bridge 131 can be formed using a material of the substrate, deposited conductive or dielectric layer and combination of these materials. Mechanical stiffness of the bridge 131 may be sufficient to provide required functionality, for example, prevent excessive bending of the routing beam, but it may not significantly affect spring constant of the structural beams 105-108 and cause asymmetry in the suspension of movable member 101.

In the embodiment of FIG. 1, the main degree of freedom for the movable structure 101 is motion in a direction perpendicular to the X-Y plane of the substrate or in the Z-direction. Therefore, spring constant of the routing beams in Z-direction may be much smaller than spring constant of the main beams in Z-direction. The difference in the Z-stiffness of structural beams 105-108 and the routing beams 112-128 can be adjusted to suit particular design needs. In some embodiments, the structural beams are rectangular and are formed from monocrystalline silicon. The structural beams 105-108 can have a rectangular cross-section with a width of 50 um Ws and thickness of 10 um Ts. As shown, eight metal routing beams can have widths "Wr" of 5 µm and thickness "Tr" of 1 µm. Thus, in some embodiments, the cross sectional area of the structural beams can be ten times greater than the cross sectional area of the routing beams where the length of all beams can be assumed as the same.

It is known that bending stiffness $S_{bend}$ or spring constant of the beam with rectangular cross-section can be calculated as: $S_{bend}=K*\min(W, T)^3*\max(W,T)/L^3$, where W, T, L are width, thickness, and length of the beam, correspondingly, and K is a numerical coefficient, which depends on type of connection on ends of the beams (both ends are clamped, one free end, etc.). In this example coefficients K and length L of all the structural and all the routing beams can be assumed to be the same. Therefore, the ratio of spring constant of the set of four structural beams to the set of eight routing beams is equal to: $(4*10^3*50)/(8*1^3*5)=5000$. (Note, the mechanical stiffness of the bridge 131 is not taken into account) Even a significant instability of mechanical parameters of the routing beams in this example, clearly has very limited effect on the mechanical and dynamic parameters of overall suspension.

Referring to FIG. 1B, a cross-sectional view, A-A of FIG. 1A through a suspension area is illustrated. Portions of the substrate have been micro-machined away to form a relief area 113 that can separate at least a portion of the movable structure 101 from a stationary frame 102. Monocrystalline silicon substrate/wafer 100 can be used for manufacturing of the MEMS device. Accordingly, the wafer 100 can be etched to form a portion of the MEMS device that can move referred to as a movable structure 101. The movable structure 101 can be suspended by a set of structural beams 107, and 108, and a set of conductive or routing beams 122, 124, 126, and 128 (122-128). Both the structural beams 107 and 108 and the routing beams 12-128 can be connected on one end to the frame 102 and on another end to the movable member 101.

The structural beams 107, and 108 can be formed by micromachining monocrystalline silicon out of the wafer 100. The movable structure 101, structural beams 107, and 108 and routing beams 122-128 represent remaining material of the wafer after micromachining has been performed on portions of the body of substrate 100. As illustrated, in cross-section A-A the thickness or cross sectional area of the structural beams 107 and 108 is significantly smaller than thickness or cross sectional area of the substrate 100. The routing beams 122-128 can be manufactured of metal to allow the routing beams 122-128 to transfer power and/or electrical signals from the frame 102 to the movable member 101.

In some embodiments, conductive routing beams 122-128 can be formed by depositing metal on top of the substrate 100 followed by etching material off of the substrate under the beams 122-128. As a result, routing beams 122-126 can be located at least partially above the surface of the wafer 100 as it can be seen in cross-section A-A. The routing beams 122-126 can have a significantly smaller thickness and width than the structural beams 107 and 108 resulting in significantly smaller mechanical strength and spring constant in Z-direction. Thus, numerous-routing beams can be added to the device without substantially affecting the dynamic or static properties of the movable structure 101.

Figure 2:
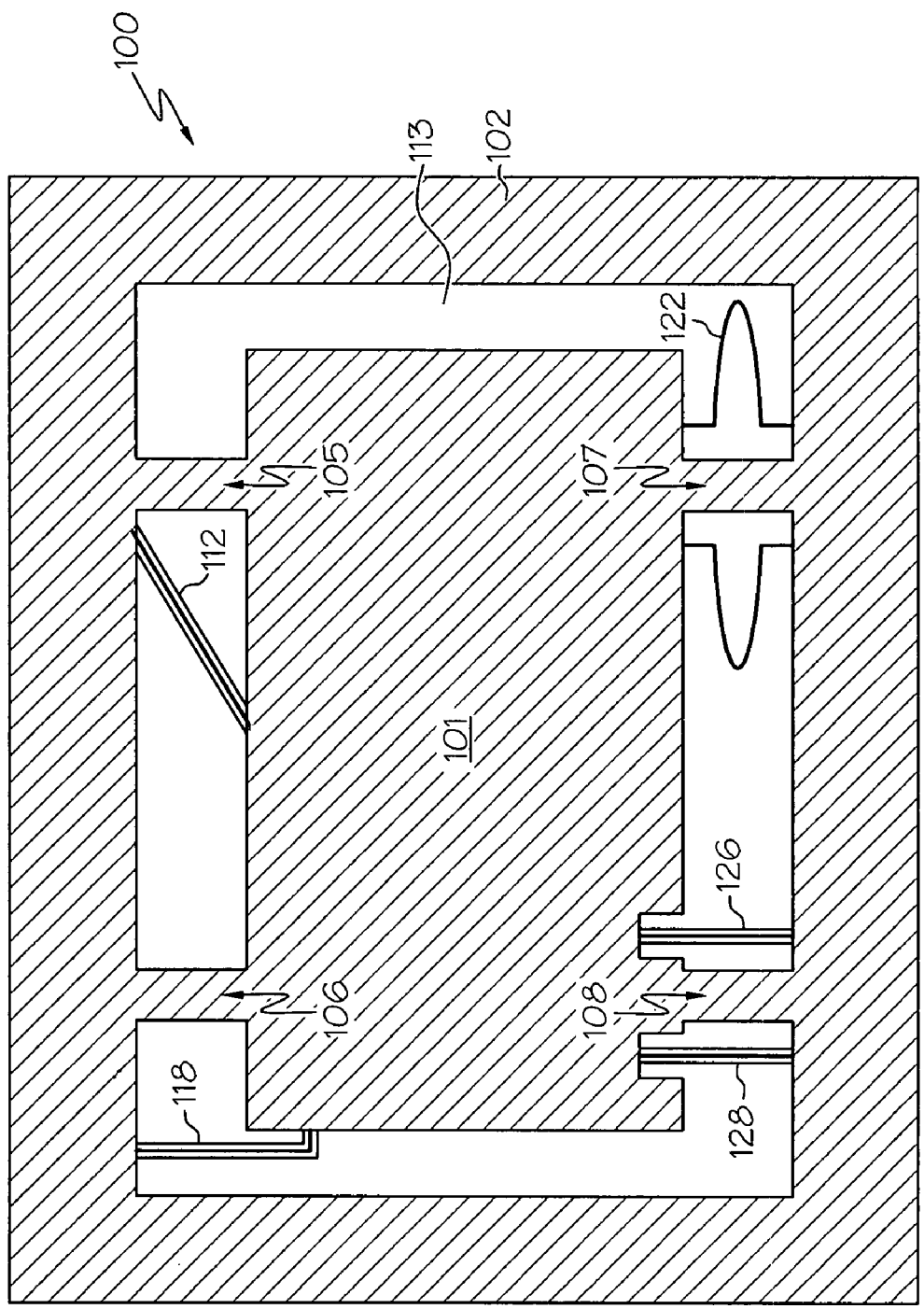
FIG. 2 is a cross sectional top view of another MEMS device allowing for additional movement of a movable member.

Referring to FIG. 2 a top view of another MEMS type device 200 is illustrated. As compared to the device illustrate in FIG. 1A the device in FIG. 2 can have a decrease of stiffness contributed by the routing beams 112, 118, 122, 126, and 128 (112-128) with respect to the structural beams 105, 106, 107 and 108 (105-108). Portions of the substrate 100 have been etched away to form a relief area 113 that separates movable structure 101 from a stationary frame 102. Accordingly, the substrate 100 can be etched to form a portion of the MEMS device that can move. The movable structure 101 can be suspended by a set of structural beams 105-108 and routing beams 112-128, and electrically connected to the frame by a set of routing beams 112-128. Both the structural beams 105-108 and the routing beams 112-128 can be connected on one end to the frame 102 and on another end to the movable member 101.

The structural beams 105-108 can be formed by micromachining on a monocrystalline silicon substrate. The structural beams represent material that can remain after micromachining of portions of the substrate 100 is performed. The thickness of the structural beams 105-108 or cross sectional area of the structural beams 105-108 can be smaller than thickness of the substrate 100. The routing beams 112-128 can transfer/conduct electrical signals from the frame 102 to the movable member 101. Routing beams 112-128 can be formed by depositing metal on top of the substrate 100 followed by micromachining the substrate. As a result, routing beams 112-128 can be formed from metal only, from metal and dielectric layer, as for example silicon dioxide or silicon nitride, and also from metal and material of the substrate, for example silicon.

Stress in the conductive material of the routing beams can cause undesirable bending of the routing beams. In order to decrease the bending of the routing beams they can be formed as a thicker multilayer structure where a layer of dielectric or substrate material under the conductor decreases the bending of the routing beams. Layers of metal and substrate material can be separated by a dielectric layer. However, using material of the substrate as a part of the structural beams can cause significant increase in their stiffness. Some options for maintaining the large ratio of structural to routing beams spring constant is discussed below.

The suspended movable structure 101 can move in the direction perpendicular to the surface of the substrate. The routing beams have significantly smaller mechanical strength than the main beams. This can be achieved by using several design options illustrated in FIG. 2. The width of routing beams 112, 118, 122, 116, and 128 can be much smaller than width of the main suspension beams 105, 106, 107, and 108. As beam spring constant is a linear function of beam width (for a particular plane/direction), making routing beams narrower than the structural beams in a specific plane decreases the ratio of spring constants of routing beams to main suspension beams. It can be appreciated that the routing beams 112, 118, 122, 116 and 128 can be made longer than the structural beams 105-108 and the longer the beam the lower the spring constant.

In FIG. 2 the routing beams 126, 128, and 118 are parallel to the structural beams 105, 106, 107, and 108 and longer than these beams. Routing beam 112 is "straight", but not parallel to the main beams because of a different angular orientation. Beam 122 is longer than the structural beams because of its curvilinear shape. As spring constant of the beams is inversely proportional to the cube (power of three) of beam length. Thus, increasing routing beam length can substantially decreases the spring constant of the beam. Although the structural beams 105, 106, 107, and 108 are shown as straight beams in FIG. 1 and FIG. 2, they can have different geometry (length, width, height, shape).

Figure 3B:
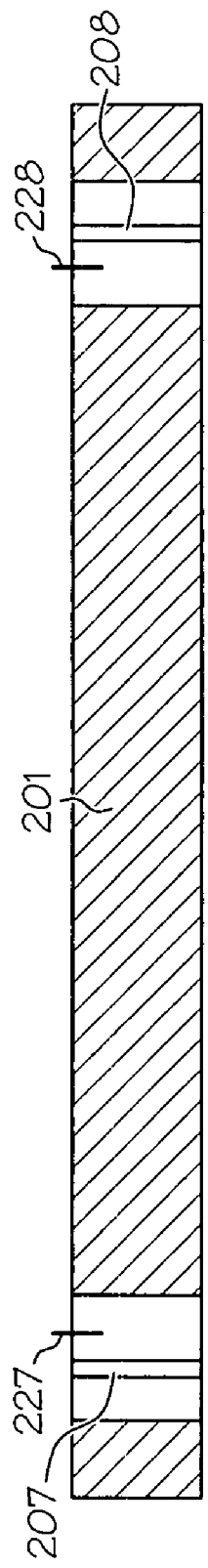
FIG. 3 is a cross sectional top view of another MEMS type device.
Figure 3A:
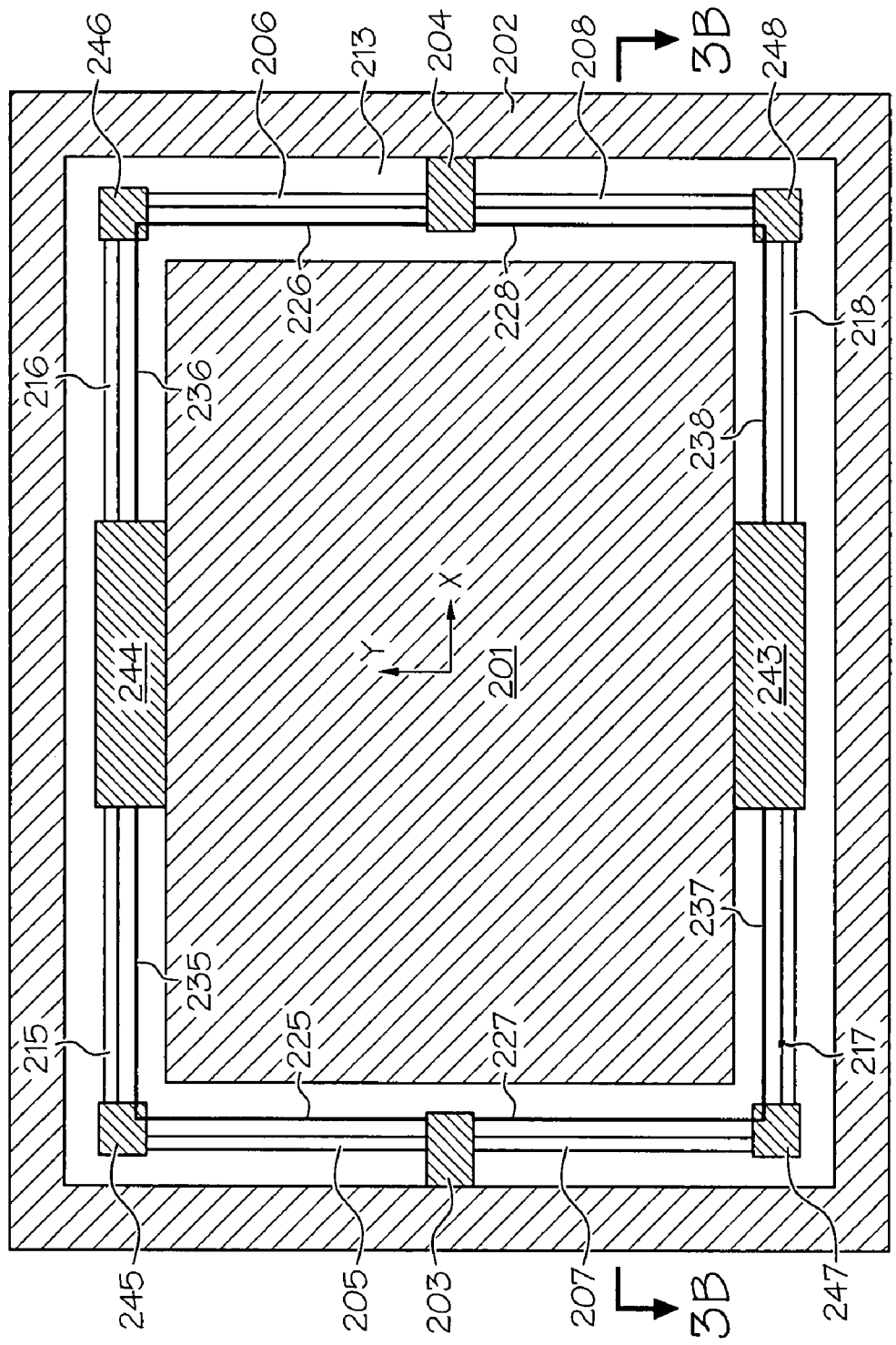

Referring to FIG. 3 a micromechanical structure with L-shaped structural beams is illustrated. The movable structure 201 can be suspended by a set of four L-shaped structural beams (205, 215), (206, 216), (207, 217), and (208, 218) (referred to as structural beams 205-218) and four L-shaped routing beams (225, 235), (226, 236), (227, 237), and (228, 238), (referred to as routing beams 225-238). As illustrated by cross-section B-B, the structural beams 205-218 can be formed by etching or micromachining through the thickness of the substrate or wafer. Each L-shaped structural beam 205-218 can have two straight beams connected at the joints

245, 246-247, and 248. The routing beams 225-238 can have both a width and a thickness that is much smaller than the width and thickness of the structural beams 205-218. The thickness of structural beams 205-218 in the thickness dimension of the substrate can be much larger than the width of the structural beams 205-218.

Therefore, in contrast with the microstructures described in FIG. 1A-B and FIG. 2, the suspended movable structure can move in the X-Y plane of the wafer and has a very limited ability to move in the Z direction perpendicular to the surface of the wafer. Assuming that motion in X and Y directions is required for functionality of the movable structure 201, spring constants of the structural beams 205-218 and the routing beams 225-238 in the X and Y directions should be considered.

When the movable structure 101 moves in X-Y plane, the structural beams 205-218 can bend in both the X and Y directions. Bending stiffness of the structural beams 205-218 can be proportional to the third power of beams width in the X-Y plane, linearly proportional to their thickness and inversely proportional to cube of the structural beams 205-218 length. Therefore, in order to reduce the contribution of routing beams 225-238 to the overall suspension stiffness, the routing beams 225-238 can be made narrower, thinner and longer than the structural beams.

In another embodiment, a MEMS device similar to the one shown in FIG. 3 has a movable structure suspended by four-structural beams having thickness of 200 µm and width of 16 µm. Sixteen routing beams have thickness of 16 µm (including conductive layers) and width of 10 µm. The length of structural beams can be made twenty percent (20%) smaller than the length of the routing beams 225-238 (for example by using some of the design approaches presented in FIG. 2). Thus, the suspension beams can bend and the movable structure can move in the plane of the wafer. Using the same formula as discussed above, one can find that the ratio of spring constant of the structural beams to the spring constant of the routing beams can be described as follows: $[(4*16^3*200)/(0.8*L)^3]/[(16*10^3*16)/L^3]=25$. Although the ratio of spring constants is not as large as in the example described with respect to FIG. 1, it is still sufficient for a significant improvement of stability of mechanical properties of the suspension, the movable structure and the MEMS device in general.

It can be appreciated that many of MEMS devices are manufactured by a release etching process where "through holes" are etched in the substrate to define the geometry of the movable structure and the suspension comprising some number of beams. In such a process some mechanical and environmental protection can be provided to the movable structure either before or after the release etch. This protection can be achieved by bonding a wafer or a die with movable structures to at least one cap wafer or at least one cap die. The purpose of this step is to either protect the movable structure from one side or enclose the movable structure in a space between two cap wafers providing protection of the movable structure from environment. Capping can also be done by wafer-level bonding.

Adding cap layer provides different options for location of both structural and routing beams. In some cases it can be beneficial to have routing beams located at the interface with the cap layer. In other cases routing beams can be located on the opposite to the cap side of the movable structure substrate.

In some embodiments, the cap may carry some functional components of the MEMS device. For example, a capacitive position sensor can be formed by creating two electrodes—one on the stationary cap and another one on the movable structure. Motion of the movable structure causes change in the mutual position of the plates of the capacitive sensor and corresponding change in the capacitance. This dependence of capacitance on position of the movable structure can be used for detecting and controlling position of the movable structure.

A representative process that can be used for fabrication of a movable structure with a suspension comprising both structural beams and routing beams is described in the next embodiment. Referring to FIG. 4 a series of steps illustrated as FIG. A, B, C, and D have been performed on a substrate 301. Referring to FIG. 4A the substrate 301 has a top side 302 and a bottom side 303. In FIG. 4 B a set of conductors 311 has been formed in the body of the Substrate 301 on the top side 302. In addition a conductive material has been deposited once substrate and a set of conductors 312 has been formed on the top of the substrate 301. It can be appreciated that deposited conductive layers 312 are elevated above/built on a top surface of the substrate 301. Conductors 311 can be insulated from the body of the substrate 301 by p-n junctions and protected from the top side with a dielectric layer. Conductors 312 can be insulated from the body of the substrate by a dielectric layer deposited or grown on the substrate prior to deposition of the conductive material. Conductors 312 can be covered with an environmentally stable protective layer, for example by dielectric.

FIG. 4C shows the substrate 301 after a first micromachining process. In FIG. 4C areas 321, 322, and 323 have been micro-machined from the top side of the substrate 301 to start the formation of a frame, a movable structure, structural beams and routing beams. The removal of material can be done utilizing many different processes including deep reactive ion etching (DRIE), other plasma etching processes, gaseous etching, for example, using $XeF_2$, wet anisotropic etching, wet isotropic etching, physical etching, as for example ion milling, or some other form of micromachining. A combination of different etching processes could also be utilized. Target etching depth for the first micromachining process can be chosen to be slightly larger than the target thickness of the routing beams. Protection of the surface of the wafer including conductors 311, 312 during the micromachining process can be provided, for example, by a layer of photoresist or by a layer of dielectric.

At the next step the substrate can be subjected to a second micromachining process. As illustrated by FIG. 4D material of the substrate can be removed from the bottom or back side of the substrate. The second micromachining step can be done to etch a profile through the wafer. As a result of the second micromachining process, the cavities 321, 322, 323 formed on the previous step meet with the cavities etched in the second micromachining process and relief areas 421 and 422 are created. Again such a process can utilize different micromachining methods such as the DRIE and other methods described above. Protection of the back side of the wafer during the second micromachining process can be provided, for example, by a layer of photoresist or by a layer of dielectric.

Similar to the side view provide in FIG. 1B, the remaining material can form a frame 402, a movable structure 401, a set of structural beams 411, 412 and a set of routing beams 415. It can be seen that there can be a misalignment between the patterns defined for the first micromachining process and the second micromachining process as illustrated by the off-set of the structural beam 411. In some cases such offset can be undesirable because it can cause formation of stress concentrators on the structural beams. In order to avoid the offset it is possible to form structural beams with smaller thickness as it is illustrated by the structural beam 412. The structural beam 412 is formed by forming a recess in the substrate 301 during the first micromachining step and etching through the remaining thickness of the substrate in the recess area during the second micromachining step. As a result thickness of the structural beam 412 is smaller than the thickness of the structural beam 411. However the structural beam 412 does not have offset between top and bottom portions and corresponding stress concentrators.

Figure 5:
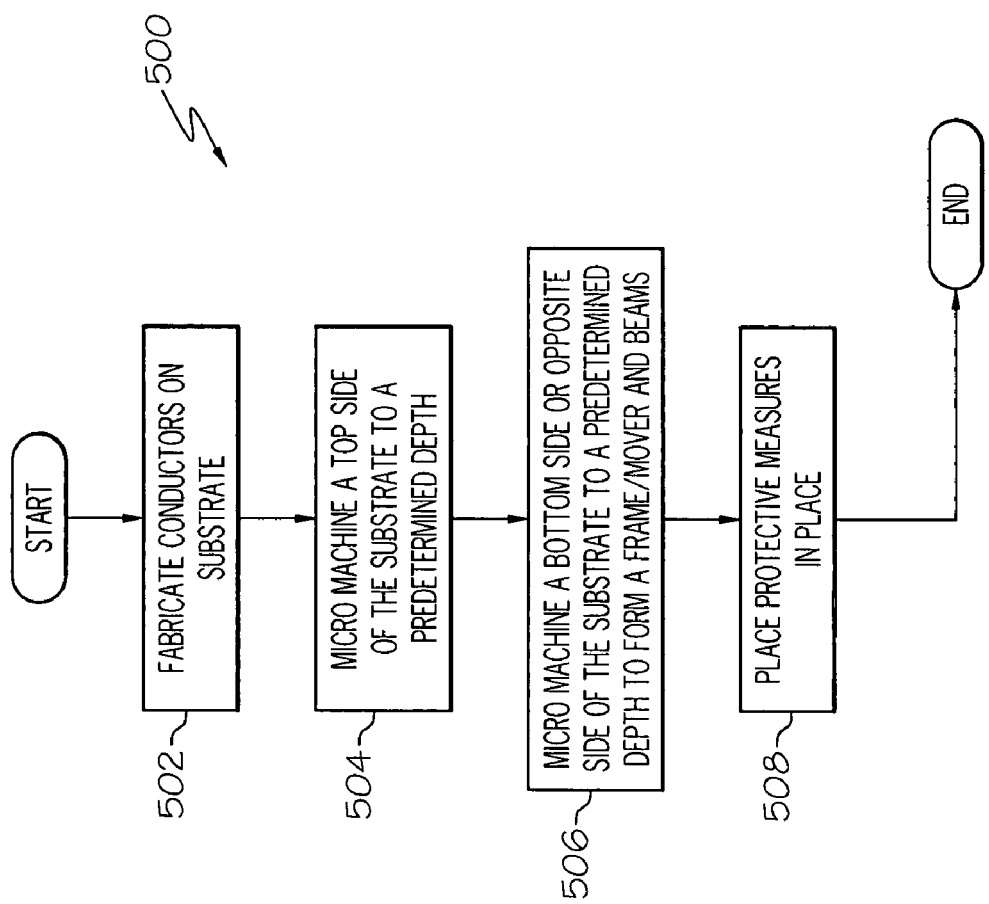
FIG. 5 is a flow diagram of a method for manufacturing a MEMS device.

Referring to FIG. 5, a flow diagram 500 of a method for fabricating a micro-electro-mechanical system (MEMS) is illustrated. Although the flow diagram may appear to describe the method as sequential actions, the order of the actions could be modified or the actions could occur concurrently without parting from the scope of this application.

As illustrated by block 502, conductors could be fabricated on a first surface of a substrate. The first surface could be considered as a top surface. The conductors could be a metallic material and the conductors could be placed on the substrate using a deposition process.

As illustrated by block 504 the top surface can be micro machined to a predetermined depth. Generally, this depth will be slightly greater than the Z height of the routing beams. The substrate can then be micro-machined from a bottom side or a side that is opposite the side machined in block 504, as illustrated in block 506.

The second side can also be micro-machined to a predetermined depth and such a depth can dictate the final Z height of the routing beams. Machining from the second side can form the frame, the routing beams, the structural beams, and the movable structure. As illustrated by block 509, a protective covering or measures can be taken to protect the components that have been formed. The process can end thereafter. After such micromachining from the top and bottom of the wafer, the MEMS structure can have a series of relief areas or spaces from a top side to a bottom side where all of the material has been etched away such that the movable structure can have some degrees of freedom to move. The set of routing beams can have a combined stiffness in some of the degrees of freedom at least ten times smaller than the combined stiffness of all structural beams in the same directions. Alternatively, total cross sectional area of all routing beams can be less than twenty percent of the combined cross sectional area of the structural beams. Such a configuration have many more conductive beams than structural beams as many conductive beams can be placed between the movable structure and the wafer without adding a significant amount of stiffness to the suspension. In general, the structural beams can provide at least over ninety percent of the resistance to deflection of the movable structure.

It can be appreciated that the suspension can be in the form of a set of parallel structural silicon beams can be fabricated as a result from the above process. These silicon beams can serve as the main structural suspension between the movable structure and the frame. In addition separate silicon routing beams can be formed where the routing beams serve the purpose of supporting conductive traces.

Also as discussed above, bridges can be created between the structural beams and the routing beams and between the routing beams. The bridges or flexible members connecting the beams can decrease undesirable bending of the routing beams due to thermo-mechanical stresses. The bridges, however, can affect the lateral stiffness of the suspension.

It will be apparent to a person skilled in the art that the invention can be used in fabrication of MEMS structures that can be utilized in different MEMS devices, including accelerometers, gyroscopes, electrical switches, movable mirrors, optical switches, add-drop multiplexers, optical radiation modulators, cantilevers with AFM tips, probe storage devices, micro-tweezers, precision MEMS-based positioning stages, electrostatic actuators, electromagnetic actuators, piezoelectric actuators, thermal actuators, valves, and other MEMS devices.

The disclosed embodiments can take the form of an entirely hardware embodiment, or an embodiment containing both hardware and software elements for the manufacture of a MEMS device. In some embodiments, the disclosed arrangements can utilize software, which includes but is not limited to firmware, resident software, microcode, etc to assist in the manufacturing of the MEMS device. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

A computer can retrieve instructions from an electronic storage medium. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. A data processing system suitable for storing and/or executing program code can include at least one processor, logic, or a state machine coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage device through intervening private or public networks. Modems, cable modem and Ethernet cards are just a few of the currently available types of network adapters.

It will be apparent to those skilled in the art having the benefit of this disclosure that the present invention contemplates methods, systems, and media that can fabricate a MEMS device. It is understood that the form of the invention shown and described in the detailed description and the drawings are to be taken merely as examples. It is intended that the following claims be interpreted broadly to embrace all the variations of the example embodiments disclosed.

What is claimed is:

1. A microelectronic electro-mechanical system (MEMS) comprising:
 a frame;
 a movable structure;
 a suspension supporting the movable structure and allowing its motion in a first direction; the suspension comprising:

at least one structural beam disposed between the frame and the movable structure to suspend the movable structure, the at least one structural beam having a spring constant in the first direction; and at least one conductor routing beam disposed between the frame and the movable structure to provide a conductive path from the frame to the movable structure to electrically interconnect a component on the movable structure with the frame, wherein the at least one structural beam has a spring constant in the first direction that is more than ten times a spring constant of the at least one conductor routing beam in the first direction.

2. The MEMS of claim 1, wherein the movable structure comprises one of an accelerometer, a gyroscope, an electrical contact, a mirror, an optical switch, a add-drop multiplexer, an optical radiation modulator, a cantilever with AFM tip, a probe storage device, a micro-tweezers, a precision MEMS-based positioning stage, an electrostatic actuator, an electromagnetic actuator, a piezoelectric actuator, thermal actuator, and valve.

3. The MEMS of claim 1, wherein the at least one routing beam comprises a plurality of routing beams, wherein the at least one structural beam comprises a plurality of structural beams and wherein the spring constant is provided by the plurality of structural beams in the first direction is over ten times the spring constant provided by the plurality of conductor routing beams in the first direction.

4. The MEMS of claim 1, wherein the spring constant of the at least one structural beam in the first direction is over twenty times greater than the spring constant provided by the at least one conductor routing beam in the first direction.

5. The MEMS of claim 1, further comprising an actuator coupled to the movable structure.

6. The MEMS of claim 1, wherein the at least one structural beam is shaped in an L formation.

7. The MEMS of claim 1, wherein the at least one conductor routing beam is longer than the at least one structural beam.

8. The MEMS of claim 1, wherein the at least one conductor routing beam has a cross sectional area that is more than ten times smaller than a cross sectional area of the at least one structural beam.

9. A method comprising:
fabricating a conductor on a first side of a substrate;
removing material comprising portions of the substrate from the first side of the substrate; and
removing material comprising portions of the substrate from a second side of the substrate, the second side opposite the first side, wherein the removing the material comprising portions of the substrate from the first side and from the second side of the substrate form a frame, a movable structure capable of moving in a first direction and a suspension supporting the movable structure, allowing motion of the movable structure in the first direction, the suspension comprising at least one structural beam and at least one conductor routing beam, the at least one conductor routing beam comprising a conductor to electrically interconnect a component on the movable structure with the frame, wherein the at least one structural beam is disposed between the frame and the movable structure to suspend the movable structure and provides a spring constant in the first direction that is over ten times a spring constant provided by the at least one conductor routing beam.

10. The method of claim 9, wherein fabricating comprises depositing an insulating dielectric and a metal layer.

11. The method of claim 9, further comprising depositing a protective layer on the at least one structural beams.

12. The method of claim 9 wherein the fabricating a conductor on the first side of the substrate comprises one of, depositing a doped layer on the substrate, depositing a layer of silicide on the substrate, depositing a metal layer on the substrate, depositing a layer of poly-silicon on the substrate, depositing a layer of conductive material.

13. The method of claim 9, wherein removing material comprises utilizing one of the following a deep reactive ion etching process, a plasma etching process, a gas etching process, a wet anisotropic etching process, a wet isotropic etching process or a combination thereof.

14. The method of claim 9, wherein the at least one conductor routing beam is fabricated longer than the at least one structural beam.

15. The method of claim 9, further comprising fabricating a bridge between two suspension beams.

* * * * *